United States Patent
Patti et al.

(10) Patent No.: US 8,803,145 B2
(45) Date of Patent: Aug. 12, 2014

(54) BOND PAD MONITORING STRUCTURE AND RELATED METHOD OF DETECTING SIGNIFICANT ALTERATIONS

(75) Inventors: Davide Giuseppe Patti, Mascalucia (IT); Manuela Larosa, Giarre (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 13 days.

(21) Appl. No.: 13/599,271

(22) Filed: Aug. 30, 2012

(65) Prior Publication Data

US 2013/0048982 A1 Feb. 28, 2013

(30) Foreign Application Priority Data

Aug. 31, 2011 (IT) .................. MI2011A1568

(51) Int. Cl.
*H01L 29/10* (2006.01)
(52) U.S. Cl.
USPC ............................................ 257/48; 257/774
(58) Field of Classification Search
CPC ........................................................ H01L 29/00
USPC ............ 257/48, 773–775, E21.158, E23.011, 257/E23.179, 734, 535, 758, E23.142, 257/E23.144; 438/14, 17, 18, 612, 652, 666
See application file for complete search history.

(56) References Cited

U.S. PATENT DOCUMENTS

| 6,395,568 B1 | 5/2002 | Blish et al. |
| 6,555,922 B1 | 4/2003 | Nakagawa |
| 6,838,769 B1 * | 1/2005 | Chittipeddi et al. .......... 257/758 |
| 2004/0145045 A1 | 7/2004 | Huang et al. |
| 2004/0217487 A1 | 11/2004 | Low et al. |
| 2006/0103031 A1 | 5/2006 | Wu |
| 2006/0189007 A1 | 8/2006 | Aoki et al. |
| 2008/0246491 A1 | 10/2008 | Ogawa et al. |
| 2010/0201000 A1 * | 8/2010 | Antol et al. .................... 257/776 |

* cited by examiner

*Primary Examiner* — Yu-Hsi D Sun
*Assistant Examiner* — Christina Sylvia
(74) *Attorney, Agent, or Firm* — Allen, Dyer, Doppelt, Milbrath & Gilchrist, P.A.

(57) ABSTRACT

A passive bond pad condition sense structure may be configured to be electrically stimulated and tested for detecting an anomalous or altered electrical characteristic caused by stress or aging of the bond pad capacitively coupled to it. The related bond pad condition testing or monitoring system may include relatively simple stimulating and sensing circuits that may be wholly embedded in the integrated circuit device.

16 Claims, 4 Drawing Sheets

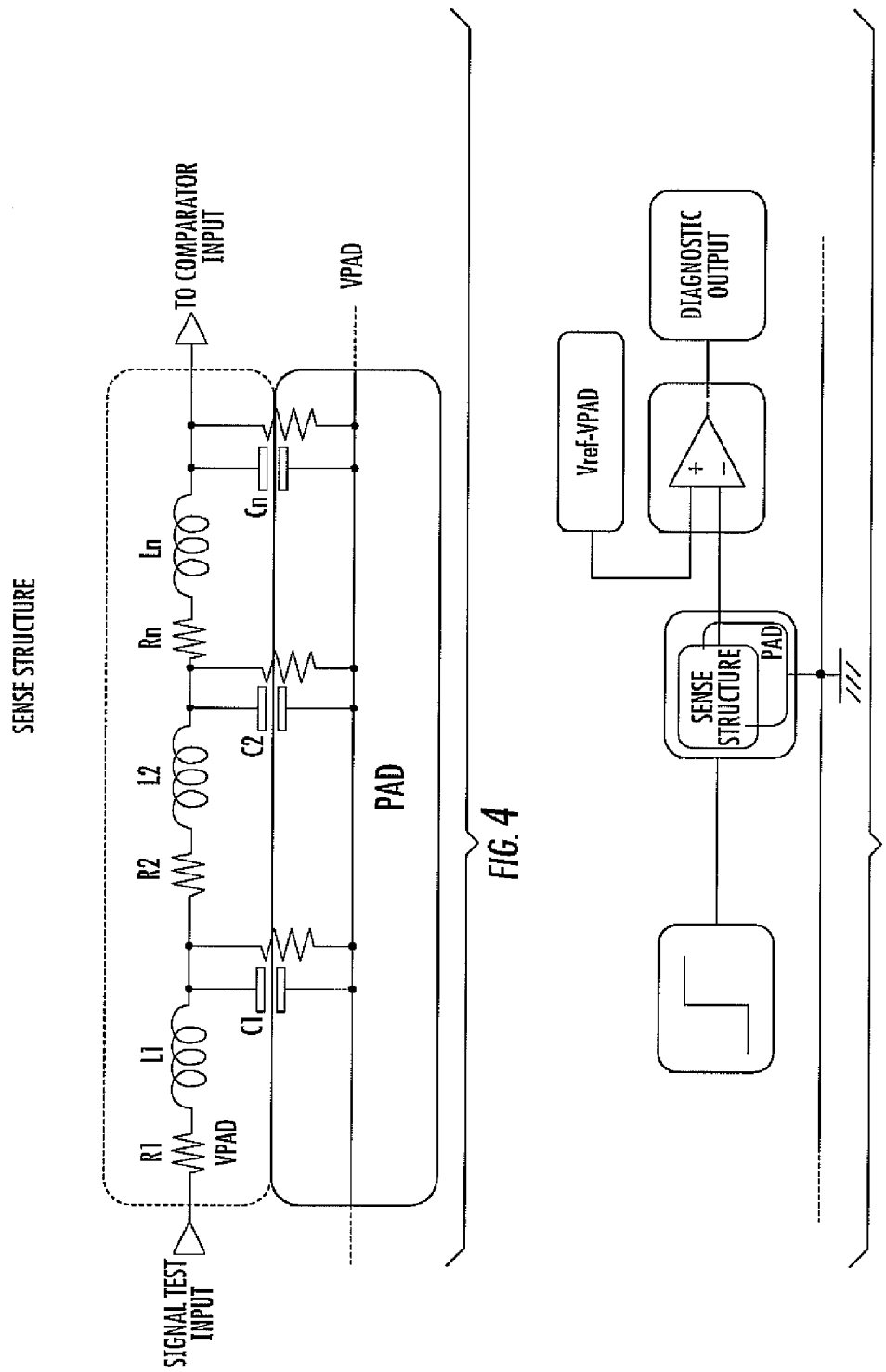

BOND PAD MONITORING STRUCTURE AND RELATED METHOD OF DETECTING SIGNIFICANT ALTERATIONS

FIELD OF THE INVENTION

The present disclosure relates to reliability assessment of integrated circuit devices, and, in particular, to a sensing structure of stress, aging, or other causes of alteration of electrical characteristics of a pad-wire bond in a packaged integrated circuit device.

BACKGROUND OF THE INVENTION

Bond pads defined in what would normally be the top-most metal layer deposited according to the process flow, provide sufficiently large areas onto which a bonded termination of a connection wire, the size of which is many times larger than the integrated circuit wiring defined in the metal layer, may be made. Bonding is commonly done with a thermo-sonic bonding technique, which is well known. Thicknesses of the normally multiple metal layers, interleaved with isolation layers, of present technology integrated circuit devices are extremely small, and the bonding process may induce microcracks in the metal layer of a bond pad. In time, these microcracks may progressively propagate for many reasons, including the repeated thermal cycling to which the packaged device may be subject during its operating life. Bond pad cratering in another possible legacy of the wire bonding process may subtly lead to failures of the electrical continuity with the surface wiring defined in the metal layer that connects the circuital node of the pad to be accessible through a device pin.

These reliability issues of bond pad connections have fostered research in failure mechanisms and in quality testing techniques. These reliability issues of bond pad connections have also fostered research in monitoring, in time and in a non-destructive manner, the condition of a bond pad to detect signs of a likelihood to fail.

U.S. Pat. No. 6,395,568 discloses a method and apparatus for sensing the existence of bond pad cratering based on the exploitation of a transistor structure. The transistor structure normally underlies the bond pad as part of an electrostatic discharge (ESD) device that is formed under the strings of perimetrically organized bond pads for protecting sensitive circuitry from disruptive electrostatic voltages that may be applied through the device pins while handing them. The method is based on sensing an anomalous current leakage through the ESD structure.

U.S. Patent Application Publication No. 2008/0246491 discloses a method and related system for testing the presence of a crack in a bond pad of a device under test. The device under test is connected to an external test apparatus that includes a bridge circuit coupled to an electrical signal source adapted to measure an impedance between a purposely made test bond pad and a bond pad of the functional circuitry of the integrated circuit to be tested.

U.S. Application Publication No. 2004/0217487 discloses a crack detection structure for a bond pad. The detection structure comprises a stack of a plurality of interleaved electrically conductive layers and non-electrically conductive (isolation) layers. A crack in at least one of the non-electrically conductive layers of the test structure that, differently from the others, has no vias formed therethrough, is detectable as a leakage current between the bond pad and an underlying electrically conductive layer of the structure.

Known bond pad monitoring apparatuses are either complex or generally require numerous stacked layers purposely made under the bond pad or an ancillary test bond pad to be coupled to external test apparatus.

SUMMARY OF THE INVENTION

An incomparably simpler bond pad monitoring structure, less burdensome to be integrated in the fabrication process flow of the integrated circuit device, has been found to be outstandingly effective in detecting an abnormal value, of a significant electrical parameter, such as, for example, the impedance of an integrated sense structure, capacitively coupled to the bond pad, as a tale-telling indicator of a most probably failing bond pad. The sense structure comprises a patterned portion of a metal layer of the integrated circuit device, wherein wirings of the integrated circuit are defined. The patterned portion of the metal layer has an area corresponding to the footprint area of the actual bond pad formed by patterning another metal layer deposited over a dielectric inter-metal layer, and which electrically connects with one or more interconnected portions of the patterned underlying area of the metal layer connecting to the integrated circuit node and which is to be made accessible from outside through the bond pad, through one or more metal interconnects (vias). The rest of the area is patterned to define one or more interconnected portions of the metal layer, which may be intertwined or sideways intermeshed with the interconnected portions, but electrically isolated therefrom. The interconnector portions may remain capacitively coupled to the overhanging bond pad from which they are isolated by the dielectric inter-metal layer. Such isolated part of the patterned metal layer, which may include a single, or more preferably, numerous interconnected portions, forms a passive sense structure capacitively coupled to the overhanging bond pad, and is coupled to a source of a test stimulus input signal and to an input of a sensing circuit adapted to generate a diagnostic signal, respectively.

The test stimulus input signal source may be a voltage step generator, and the sensing circuit may be adapted to sense either voltage or current, depending on whether the sense structure, as fabricated, has an impedance of weak or preeminent resistive character. According to a preferred embodiment, the sensing circuit senses the voltage response of the structure to a voltage step stimulus. The sensing circuit includes a comparator having an inverting input connected to the passive sense structure for comparing the step response waveform of the sense structure with a reference waveform or with equivalent discriminating threshold values to produce a diagnostic signal.

An anomalous modification of the step response from the response expected from design calculations and/or verifications carried out on test samples, indicative of a modification of the impedance of the passive test structure capacitively coupled to the overhanging bond pad, held at a fixed or constant potential during the test (typically to ground potential), has been found to be strictly correlated with changes of the physical coupling of the sense structure with the overlying bond pad, and generally corresponds to a progression of a failing mechanism of the bond pad.

The relatively simple stimulating and sensing circuitry may, wholly or in part, belong to an external test apparatus connectable to the substantially passive sense structure through dedicated or temporary pads of the integrated circuit device. However, the relative simplicity of the stimulating and sensing circuitry lends itself to be integrated in the device, thus offering wholly embedded means of testing packaged devices and of monitoring, in time possible degradations of bond pad characteristics, for periodic reliability checks.

BRIEF DESCRIPTION OF THE DRAWINGS

FIG. 4 is a schematic diagram of an equivalent electrical circuit of the sense structure according to the present invention.

FIG. 5 is a basic circuit diagram of a sensing circuit according to an embodiment of a bond pad monitoring system of the present invention.

DETAILED DESCRIPTION OF THE PREFERRED EMBODIMENTS

Figure 1:
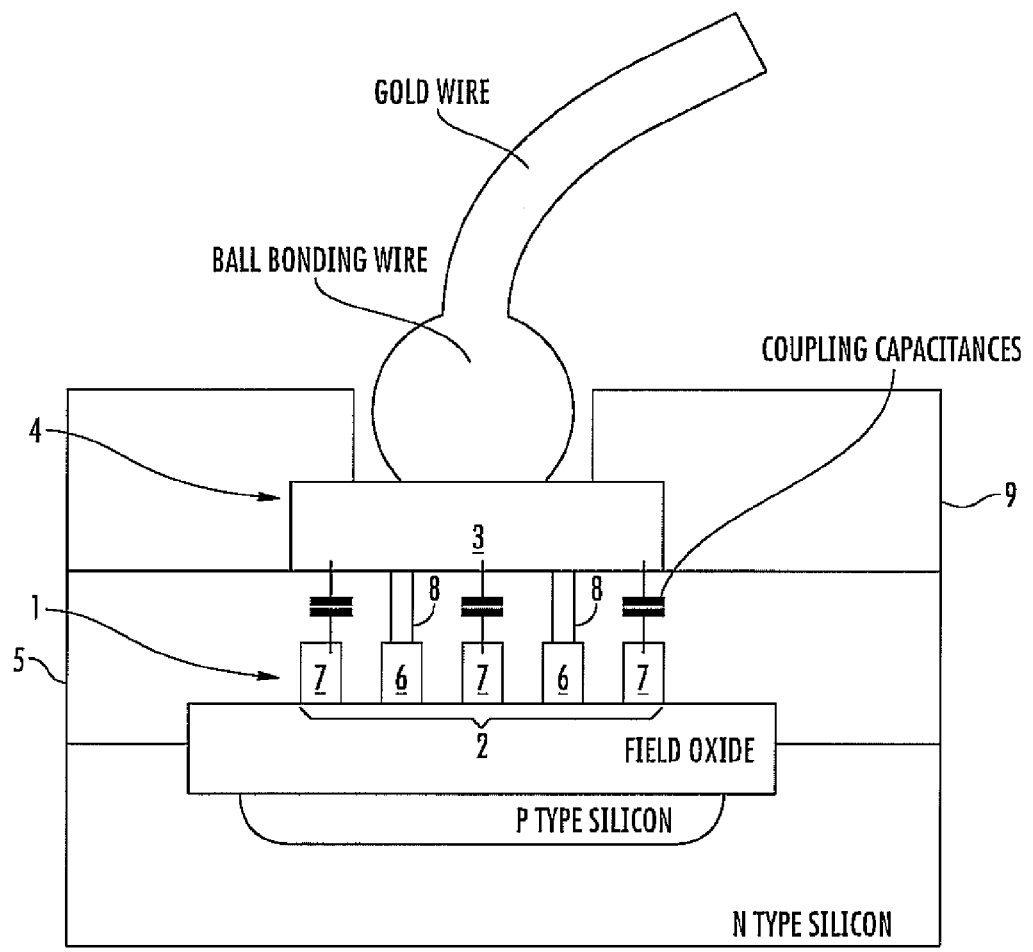
FIG. 1 is a schematic vertical cross-sectional view of a bond pad according to the present invention, and of the sense structure formed in the footprint area of the overlying bond pad of a top most patterned metal layer of wirings of the functional circuitry of the integrated circuit device.

According to an illustrated exemplary embodiment, a bond pad condition testing or monitoring structure in an integrated circuit device, for detecting anomalous electrical characteristics of the structure, as being indicative of a propensity of a failure of the bond pad, is formed in a metal layer defining metal wirings. As depicted in FIG. 1, a metal layer 1 of defined wirings of an integrated circuit has, defined in an area 2 coincident with the footprint of an overhanging bond pad 3, defined in an upper metal layer 4 over an inter-metal dielectric layer 5, one or more finger portions 6 interconnected together that, according to the exemplary embodiment shown, may extend from a common base strip (not visible in FIG. 1). The one or more finger portions 6 extend from the common base strip in a hair comb shape, laterally separated from a specular hair comb array of one or more finger portions 7, similarly extending from a base strip (not visible in FIG. 1) and intermeshed with the fingers 6 of the first array.

The first hair comb array of interconnected finger portions 6 connects to the integrated circuit wiring (not visible in FIG. 1) and, through numerous metal interconnects (vias) 8 purposely made through the dielectric inter-metal layer 5, to the overhanging bond pad 3, forming a substantially equipotential metal structure of the integrated circuit node made accessible through the pin of the packaged device wired to the bond pad. Differently, the other hair comb array of interconnected finger portions 7 is electrically isolated from the first array and from the correspondent integrated circuit node, though remaining capacitively coupled to the overhanging bond pad across the dielectric inter-metal layer 5 forming the passive sense structure.

Figure 2:
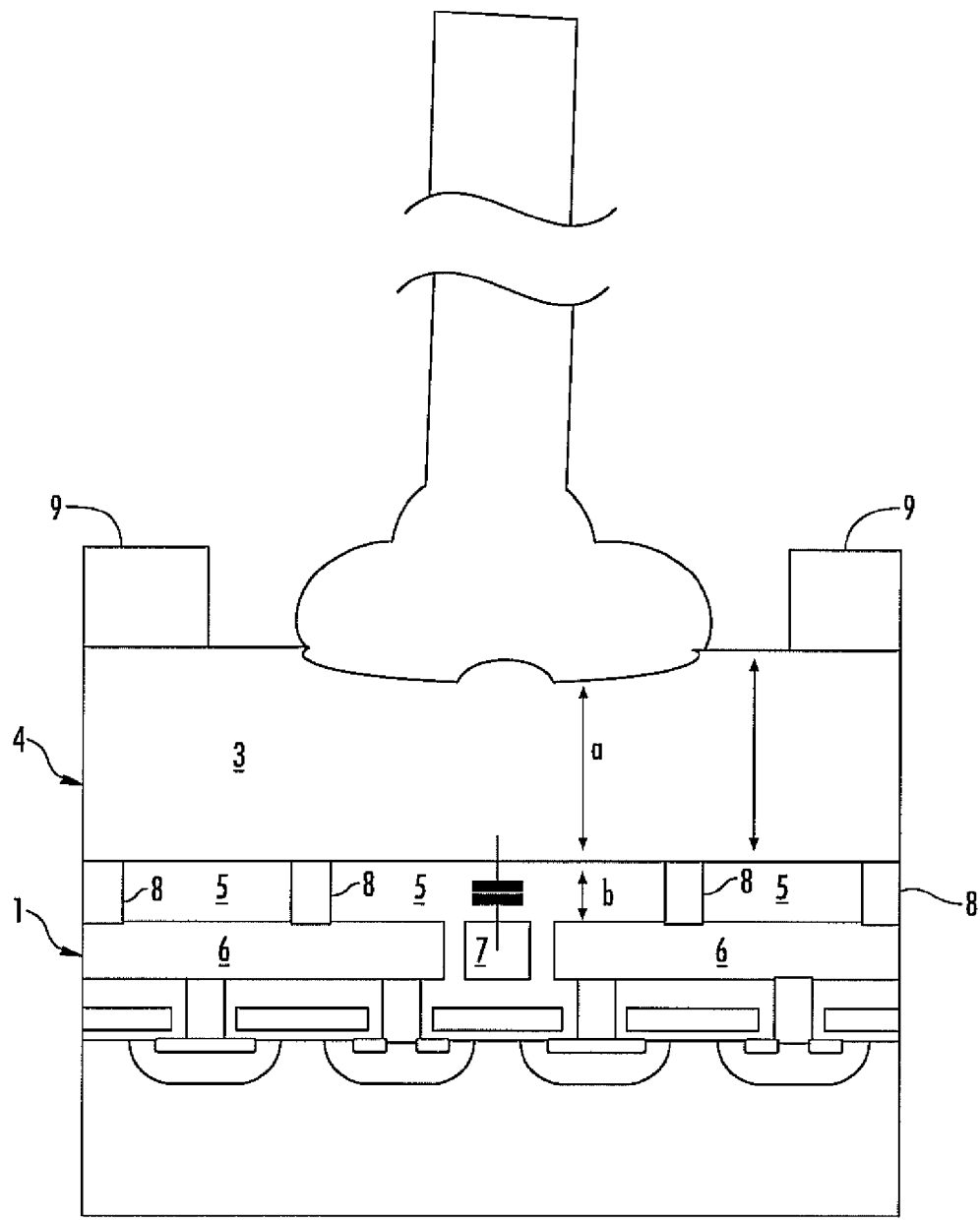
FIG. 2 is a schematic orthogonal cross-sectional view of the bond pad and of the sense structure defined underneath in accordance with an embodiment of the present invention, taken along the cut line indicated in FIG. 3.
Figure 3:
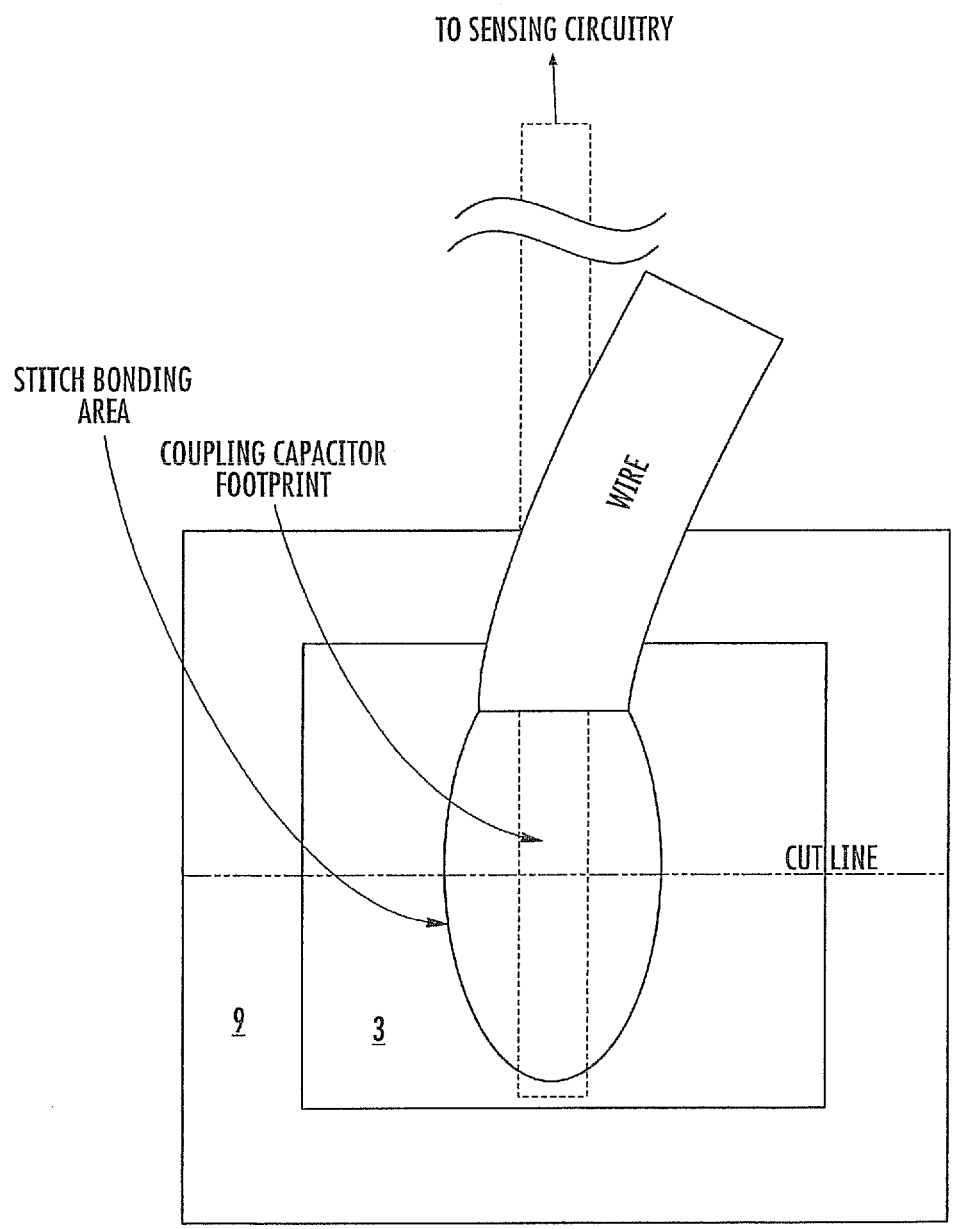
FIG. 3 is a top view of the bond pad of FIG. 2.

FIGS. 2 and 3 are a schematic orthogonal cross-sectional view and a plan view, respectively, of the integrated structure of the bond pad and of the sense structure defined underneath it, as illustrated in FIG. 1. In mock-up test samples used for verifying effectiveness and reliability of the pad condition testing sense structure of this disclosure, and the thicknesses (a) and (b), indicated in FIG. 2, were respectively varied within the ranges: 0.5 to 6.0 μm for (a) and 0.4 to 1.0 μm for (b).

As will be evident to the expert reader, the metal layer 1 may eventually correspond to the would-be top most metal layer defining the wirings of the integrated circuit, and the upper metal layer 4, defining the bond pads of the packaged semiconductor device, may even be a purposely added metal layer. As may be customary, after definition of the bond pads and bonding of the ball termination of the connecting wire (typically of gold), a passivation topping layer 9 of polymide may be deposited over the defined parts of the upper metal layer 4.

FIG. 4 shows the equivalent electrical circuit of the passive sense structure according to the embodiments described herein. The symbolic electrical components correspond to the distributed resistance and inductance, and to the coupling capacitance of the physical structure created underneath the bond pad metal. The input and output arrows indicate respective connection wirings departing, for example, from opposite ends of a base strip of the interconnection of all the finger portions 7, spaced apart on the footprint area 2. The respective connection wirings are adapted to connect, respectively, to a source of a voltage step stimulating signal and to an inverting input of a comparator. The output state of the components depends on the result of the comparison of the step response waveform of the passive sense structure having a complex inductance. The output state is characterized by a significant reactive component, with a reference waveform or with equivalent time-correlated voltage thresholds.

Even maintaining customarily minimized bond pad sizes, resistances, inductances, and coupling capacitances of the equivalent circuit of the passive sense structure may be tailored for enhanced sensitivity by changing the defined patterns of the two isolated parts in the footprint area of the metal. Patterns, other than two intermeshed comb-like parts, as exemplified in the figures may be implemented, such as, for example, two intertwined spirals, and other pairs of intertwined parts, which may eventually account for dissimilar total areas for incrementing the coupling capacitance of the sense structure at a detriment of the total area of the equipotential part connecting to the overhanging bond pad.

FIG. 5 schematically depicts the basic circuit arrangement for stimulating the sense structure by applying a voltage step signal to it, and analyzing its step response waveform to detect an anomalous or modified behavior. The anomalous or modified behavior may eventually be signalled by an output stage adapted to produce a diagnostic signal indicative of the output state of the comparator consequent to a voltage step stimulus of the passive sense structure.

As will be readily recognized by the expert reader, the relative simplicity of implementation of both the voltage step source and the step response analyzing circuitry (sensing circuitry), makes a partial or whole integration of the sensing system in the packaged integrated circuit device that will thus be offering an embedded sub-system useful for monitoring in, time the bond pad condition possible and economical.

That which is claimed is:

1. A bond pad condition sense structure in an integrated circuit device comprising:
   a bond pad;
   a patterned portion of a metal layer of the integrated circuit device wherein wirings of the integrated circuit are defined, coincident with a footprint area of said bond pad, having defined therein at least one interconnected first portion coupled to a node of the integrated circuit device, and to be externally accessible through a device pin coupled to said bond pad, and at least one interconnected second portion, interleaved with said at least one interconnected first portion and electrically isolated therefrom;
   a dielectric inter-metal isolation layer over said patterned portion; and a plurality of metal interconnects through said dielectric inter-metal isolation layer contacting said at least one interconnected first portion;

said bond pad defined in an upper metal layer over said dielectric inter-metal isolation layer, coupled to said at least one interconnected second portion by said plurality of metal interconnects, and capacitively coupled to said at least one interconnected second portion.

2. The bond pad condition sense structure of claim 1, wherein said at least one interconnected second portion is sideways interleaved with said at least one interconnected first portion.

3. The bond pad condition sense structure of claim 1, wherein said plurality of metal interconnects comprises a plurality of vias.

4. The bond pad condition sense structure of claim 1, wherein said bond pad is configured to be electrically stimulated by a voltage step signal source.

5. A bond pad condition sensing system comprising:
a sense structure comprising
a bond pad,
a patterned portion of a metal layer of an integrated circuit device wherein wirings of the integrated circuit are defined, coincident with a footprint area of said bond pad, having defined therein at least one interconnected first portion coupled to a node of the integrated circuit device, and to be externally accessible through a device pin coupled to said bond pad, and at least one interconnected second portion, interleaved with said at least one interconnected first portion and electrically isolated therefrom;
a dielectric inter-metal isolation layer over said patterned portion, and
a plurality of metal interconnects through said dielectric inter-metal isolation layer contacting said at least one interconnected first portion,
said bond pad defined in an upper metal layer over said dielectric inter-metal isolation layer, coupled to said at least one interconnected second portion by said plurality of metal interconnects, defining a substantially equipotential structure, and capacitively coupled to said at least one interconnected second portion;
a voltage source coupled to said sense structure and configured to generate a voltage step stimulating signal; and
a sensing circuit comprising a comparator configured to compare a step response waveform of said sense structure with reference waveform, and an output stage configured to generate a diagnostic signal indicative of an output state of said comparator based upon the voltage step stimulating signal.

6. The bond pad condition sensing system of claim 5, wherein said sense structure, said voltage source, and said sensing circuit are at least partially embedded in the integrated circuit device.

7. An integrated circuit comprising:
a bond pad;
a patterned metal layer portion below a footprint area of said bond pad, and having defined therein at least one interconnected first portion, and at least one interconnected second portion interleaved with said at least one interconnected first portion and electrically isolated therefrom;
a dielectric inter-metal isolation layer over said patterned metal layer portion; and
a plurality of metal interconnects through said dielectric inter-metal isolation layer contacting said at least one interconnected first portion;
said bond pad defined over said dielectric inter-metal isolation layer, coupled to said at least one interconnected second portion by said plurality of metal interconnects, and capacitively coupled to said at least one interconnected second portion.

8. The integrated circuit of claim 7, wherein said at least one interconnected second portion is sideways interleaved with said at least one interconnected first portion.

9. The integrated circuit of claim 7, wherein said plurality of metal interconnects comprises a plurality of vias.

10. The integrated circuit of claim 7, wherein said bond pad is configured to be electrically stimulated by a voltage step signal source.

11. A bond pad condition sensing system comprising:
an integrated circuit comprising
a bond pad,
a patterned metal layer portion below a footprint area of said bond pad, and having defined therein at least one interconnected first portion, and at least one interconnected second portion interleaved with said at least one interconnected first portion and electrically isolated therefrom,
a dielectric inter-metal isolation layer over said patterned metal layer portion, and
a plurality of metal interconnects through said dielectric inter-metal isolation layer contacting said at least one interconnected first portion,
said bond pad defined over said dielectric inter-metal isolation layer, coupled to said at least one interconnected second portion by said plurality of metal interconnects, and capacitively coupled to said at least one interconnected second portion;
a voltage source coupled to said sense structure and configured to generate a voltage step stimulating signal; and
a sensing circuit comprising a comparator configured to compare a step response waveform from said integrated circuit with a reference waveform, and an output stage configured to generate a diagnostic signal indicative of an output state of said comparator based upon the voltage step stimulating signal.

12. The bond pad condition sensing system of claim 11, wherein said integrated circuit, said voltage source, and said sensing circuit are at least partially embedded in an integrated circuit device.

13. A method of making an integrated circuit comprising:
forming a bond pad;
forming a patterned metal layer portion to be below a footprint area of the bond pad, and having defined therein at least one interconnected first portion, and at least one interconnected second portion interleaved with the at least one interconnected first portion and electrically isolated therefrom;
forming a dielectric inter-metal isolation layer over the patterned metal layer portion; and
forming a plurality of metal interconnects through the dielectric inter-metal isolation layer to contact the at least one interconnected first portion;
the bond pad being defined over the dielectric inter-metal isolation layer, coupled to the at least one interconnected second portion by the plurality of metal interconnects, and capacitively coupled to the at least one interconnected second portion.

14. The method of claim 13, wherein the at least one interconnected second portion is sideways interleaved with the at least one interconnected first portion.

15. The method of claim 13, wherein forming the plurality of metal interconnects comprises forming a plurality of vias.

16. The method of claim 13, wherein the bond pad is electrically stimulated by a voltage step signal source.

* * * * *